United States Patent
Dyer et al.

(10) Patent No.: US 8,482,009 B2
(45) Date of Patent: Jul. 9, 2013

(54) SILICON-ON-INSULATOR SUBSTRATE WITH BUILT-IN SUBSTRATE JUNCTION

(75) Inventors: Thomas Walter Dyer, Pleasant Valley, NY (US); Junedong Lee, Hopewell Junction, NY (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 186 days.

(21) Appl. No.: 13/093,034

(22) Filed: Apr. 25, 2011

(65) Prior Publication Data

US 2011/0193149 A1    Aug. 11, 2011

Related U.S. Application Data

(62) Division of application No. 12/551,797, filed on Sep. 1, 2009, now Pat. No. 7,955,940.

(51) Int. Cl.
*H01L 29/786* (2006.01)

(52) U.S. Cl.
USPC ............ 257/71; 257/58; 257/296; 257/301; 257/437; 257/E27.084; 257/E27.092; 257/E21.008; 257/E21.334; 257/E21.4; 257/E21.568; 438/311; 438/370; 438/371; 438/372; 438/517; 438/458; 438/386

(58) Field of Classification Search
None
See application file for complete search history.

(56) References Cited

U.S. PATENT DOCUMENTS 5,508,219 A * 4/1996 Bronner et al. ............... 438/152
2007/0264795 A1 11/2007 Miller et al.

OTHER PUBLICATIONS

Notice of Allowance (Mail Date Jan. 31, 2011) for U.S. Appl. No. 12/551,797, filed Sep. 1, 2009.

* cited by examiner

*Primary Examiner* — Julio J Maldonado
*Assistant Examiner* — Yasser Abdelaziez
(74) *Attorney, Agent, or Firm* — Schmeiser, Olsen & Watts LLP; Wenjie Li

(57) ABSTRACT

A method of forming a SOI substrate, diodes in the SOI substrate and electronic devices in the SOI substrate and an electronic device formed using the SOI substrate. The method of forming the SOI substrate includes forming an oxide layer on a silicon first substrate; ion-implanting hydrogen through the oxide layer into the first substrate, to form a fracture zone in the substrate; forming a doped dielectric bonding layer on a silicon second substrate; bonding a top surface of the bonding layer to a top surface of the oxide layer; thinning the first substrate by thermal cleaving of the first substrate along the fracture zone to form a silicon layer on the oxide layer to formed a bonded substrate; and heating the bonded substrate to drive dopant from the bonding layer into the second substrate to form a doped layer in the second substrate adjacent to the bonding layer.

9 Claims, 4 Drawing Sheets

SILICON-ON-INSULATOR SUBSTRATE WITH BUILT-IN SUBSTRATE JUNCTION

This application is a division of U.S. patent application Ser. No. 12/551,797 filed on Sep. 1, 2009.

FIELD OF THE INVENTION

The present invention relates to the field of integrated circuits; more specifically, it relates to a silicon-on-insulator substrates with built-in junctions, method of making silicon-on-insulator substrates with built-in junctions and integrated circuit devices fabricated on silicon-on-insulator substrates with built-in junctions.

BACKGROUND OF THE INVENTION

Increasing demand for complex high-density silicon-on-insulator integrated circuit manufacturing has lead to the placement of some devices in the substrate under the buried oxide of the silicon-on-insulator substrate. Present methods of doing so cause damage to the buried oxide layer and the silicon layer on the buried oxide layer. Accordingly, there exists a need in the art to mitigate or eliminate the deficiencies and limitations described hereinabove.

SUMMARY OF THE INVENTION

A first aspect of the present invention is a method, comprising: forming an oxide layer on a silicon first substrate; ion-implanting hydrogen through the oxide layer into the first substrate, to form a fracture zone in the substrate; forming a doped dielectric bonding layer on a silicon second substrate; bonding a top surface of the bonding layer to a top surface of the oxide layer; thinning the first substrate by thermal cleaving of the first substrate along the fracture zone to form a silicon layer on the oxide layer to form a bonded substrate; and heating the bonded substrate to drive dopant from the bonding layer into the second substrate to form a doped layer in the second substrate adjacent to the bonding layer.

A second aspect of the present invention is a method, comprising: providing a silicon-on-insulator substrate, the silicon-on-insulator substrate comprising a silicon layer separated from a silicon substrate by a buried dielectric layer and including a doped layer in the substrate, the doped layer adjacent to the buried dielectric layer, the doped layer not formed by ion-implantation of a dopant species through the silicon layer; forming a photoresist layer on a top surface of the silicon layer; forming an opening in the photoresist layer, a region of the top surface of the silicon layer exposed in a bottom of the opening; ion implanting a dopant species into a portion of the doped layer under the opening to form an ion-implanted region in the doped layer, the photoresist layer blocking ion-implantation of the dopant species into the silicon layer, the dopant species of an opposite type than dopant in the doped layer; after the ion-implanting, removing the photoresist layer; and heating the silicon-on-insulator substrate to activate the dopant species in the ion-implanted region of the doped layer to form a doped region in the doped layer, the doped region and the doped layer comprising a diode.

A third aspect of the present invention is a method, comprising: providing a silicon-on-insulator substrate, the silicon-on-insulator substrate comprising a silicon layer separated from a silicon substrate by a buried dielectric layer and including a doped layer in the substrate, the doped layer adjacent to the buried dielectric layer, the doped layer not formed by ion-implantation of a dopant species through the silicon layer; forming dielectric isolation in the silicon layer, the dielectric isolation separating the silicon layer into electrically isolated silicon islands; forming dynamic random access memory (DRAM) cells in respective silicon islands, each DRAM cell comprising a field effect transistor (FET) and a respective trench capacitor, each trench capacitor of the respective trench capacitors comprising a dielectric layer isolating a doped polysilicon inner plate from a diffused outer plate, the diffused outer plate formed in the doped layer and the substrate, the doped layer electrically contacting the outer plate, and forming an electrically conductive contact extending through the trench isolation and the buried dielectric layer into the doped layer.

A fourth aspect of the present invention is an electronic device, comprising: a silicon-on-insulator substrate, the silicon-on-insulator substrate comprising a (i) silicon layer separated from a silicon substrate by a buried dielectric layer, the buried dielectric layer including a silicon oxide layer adjacent to the silicon layer and a dopant depleted dielectric layer adjacent to the silicon oxide layer, and (ii) a doped layer in the substrate, the doped layer adjacent to the dopant depleted dielectric layer; dielectric isolation in the silicon layer, the dielectric isolation separating the silicon layer into electrically isolated silicon islands; dynamic random access memory (DRAM) cells in respective silicon islands, each DRAM cell comprising a field effect transistor (FET) and a respective trench capacitor, each trench capacitor of the respective trench capacitors comprising a dielectric layer isolating a doped polysilicon inner plate from a diffused outer plate, the diffused outer plate formed in the doped layer and the substrate, the doped layer electrically contacting the outer plate; and an electrically conductive contact extending through the trench isolation and the buried dielectric layer into the doped layer.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Silicon-on-insulator (SOI) substrates comprise an upper silicon layer separated from a supporting silicon substrate by a buried oxide (BOX) layer. SOI substrates of the embodiments of the present invention are fabricated with a doped silicon layer under a buried insulator layer forming a built-in junction thereby eliminating or reducing the need to form such a layer during fabrication of an integrated circuit using the SOI substrate with a built-in junction.

Figure 1A:
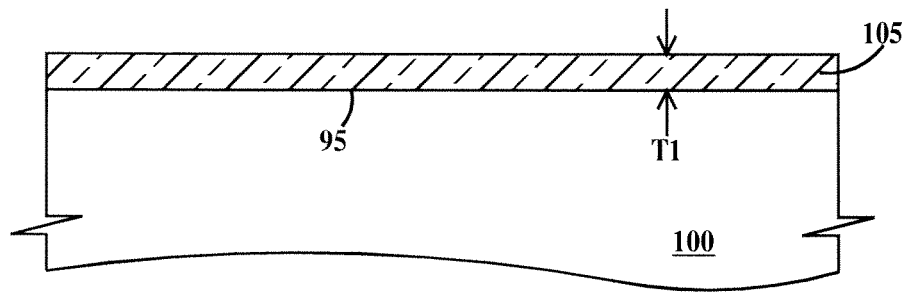
FIGS. 1A through 1E are cross-sectional drawings illustrating fabrication of a silicon-on-insulator substrate according to embodiments of the present invention.

FIGS. 1A through 1E are cross-sectional drawings illustrating fabrication of a silicon-on-insulator substrate according to embodiments of the present invention. In FIG. 1A, formed on top surface 95 of a single-crystal silicon substrate 100 is a silicon oxide layer 105. In one example, silicon oxide layer 105 is formed by thermal oxidation of substrate 100. Silicon oxide layer 105 has a thickness T1. In one example T1 is between about 50 nm and about 300 nm. In one example, silicon oxide layer 105 is formed by thermal oxidation of the silicon substrate 100 in the presence of water vapor (e.g. steam oxidation) with or without oxygen.

Figure 1B:
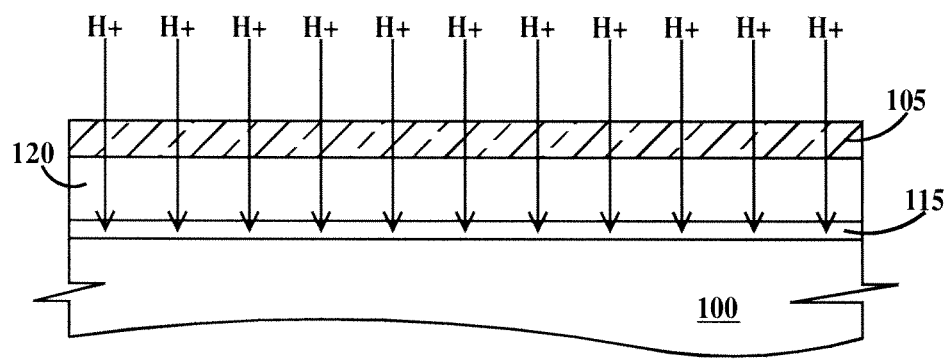

In FIG. 1B, a hydrogen ion-implantation is performed to form a fracture zone 115 in first substrate 100. A single crystal silicon layer 120 intervenes between fracture zone 115 and oxide layer 105. In one example, the hydrogen ion implantation is performed at a temperature between about 20° C. and about 450° C.

Figure 1C:
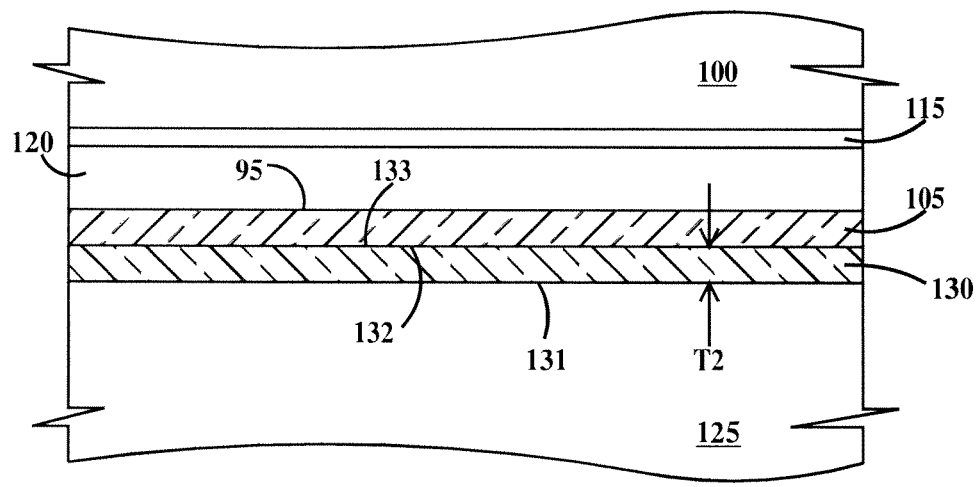

In FIG. 1C a semiconductor substrate 125 having a dielectric doped bonding layer 130 formed on a top surface 131 of substrate 125 is provided. A top surface 132 of bonding layer 130 is bonded to a top surface 133 of silicon oxide layer 95. Bonding layer 130 has a thickness T2. In one example T2 is between about 50 nm and about 300 nm. In one example, bonding is performed at room temperature (i.e., between about 18 ° C. and about 24° C.) as a result of van der Walls attraction between dangling bonds on the two contacting surfaces. In one example substrate 125 is single-crystal silicon. In one example substrate 125 is P-doped single-crystal silicon. In one example, substrate 125 has a thickness between about 700 microns and about 800 microns. In one example, bonding layer 130 is doped glass (e.g., arsenic or phosphorus doped glass). In one example, bonding layer 130 is N-doped glass. Glass according to embodiments of the present invention has a different chemical composition than silicon oxide. In one example bonding layer 130 is formed by in-situ deposition of doped glass (the glass and dopant are simultaneously deposited). Examples of deposition processes include chemical vapor deposition (CVD), low pressure CVD (LPCVD), plasma assisted CVD (PECVD) and sputter deposition. In sputter deposition, a target of doped glass is bombarded by a beam of non-reactive ions (e.g., argon) in a vacuum chamber, and particles of the target are ejected from the target and coat a substrate placed in the vacuum chamber. In one example, bonding layer 130 is doped silicon oxide formed by thermal oxidation of substrate 125 in the presence of water vapor (e.g. steam oxidation) with or without oxygen to form an undoped bonding layer followed by ion-implantation of the dopant species into the undoped bonding layer to form bonding layer 130. In one example, the dopant is contained within bonding layer 130 and the ion-implantation does not implant dopant species into substrate 125. In one example, the peak of the dopant distribution is in said second substrate. In one example, the dopant in bonding layer 130 is selected from the group consisting of arsenic (As), antimony (Sb), phosphorus (P) and boron (B), with As and Sb preferred because of their lower diffusivity. In one example, the dopant in bonding layer 130 comprises about 2% to about 10% by weight of doped glass.

Figure 1D:
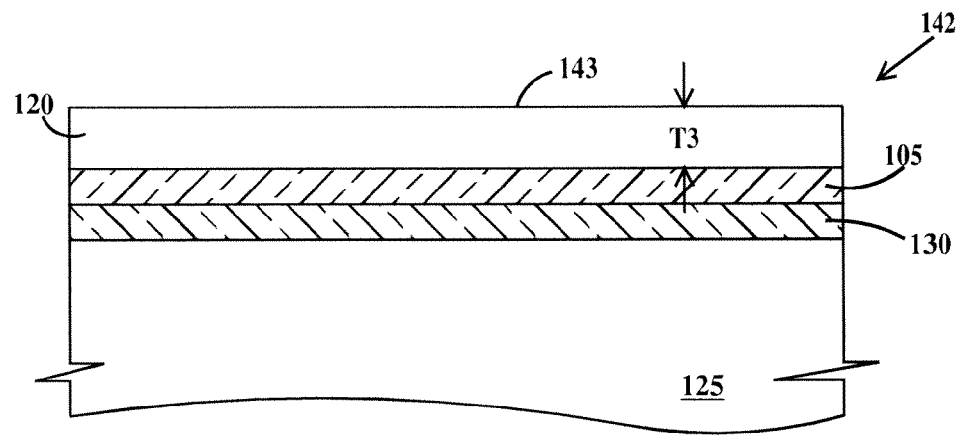

In FIG. 1D, substrate 100 (see FIG. 1C) has been cleaved (along fracture zone 115 of FIG. 1C) from silicon layer 120 by thermal cleaving (e.g., annealing) at a temperature between about 100° C. and about 500° C. to form a bonded substrate 142. The terms annealing and heating may be used interchangeably. Annealing is a heating at elevated temperature (at least about 100° C.). Annealing may be performed in an inert atmosphere. This cleave-anneal also increases the strength of the silicon oxide layer 105 to bonding layer 130 bond. After cleaving, additional optional processes such a chemical-mechanical polishing (CMP) of a top surface 143 of silicon layer 120 or a post-cleave anneal at a temperature of about 1000° C. or greater may be performed to smooth the exposed surface of silicon layer 120. Silicon layer 120 has a thickness T3. In one example T3 is between about 20 nm and about 100 nm.

Figure 1E:
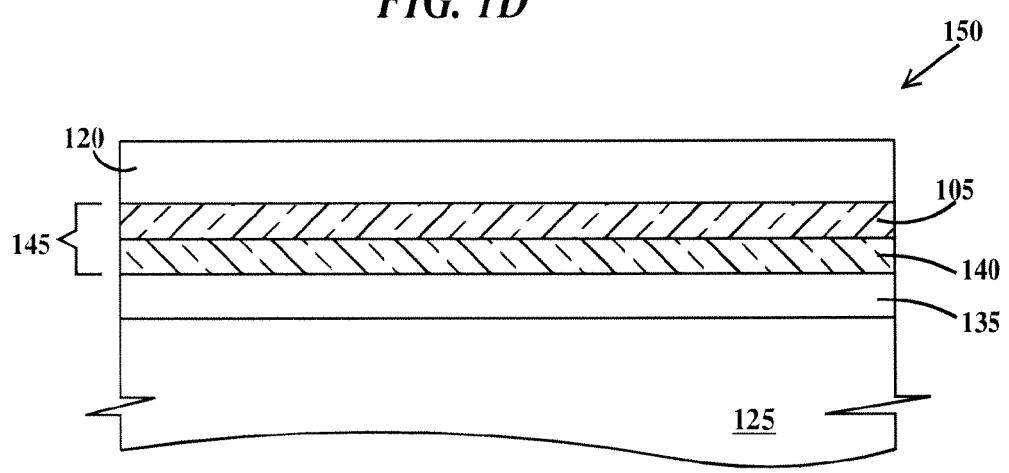

In FIG. 1E, an optional activation anneal process is performed to form an electrically conductive doped layer 135 in silicon substrate 125 adjacent to a dopant depleted dielectric layer 140. When a post-cleave anneal has been performed this step is not necessary as long as the post-cleave anneal was performed at a temperature high enough to diffuse and activate the dopant species. Dopant depleted dielectric layer 140 and doped layer 135 are formed by dopant in bonding layer 130 (see FIG. 1D) diffusing out of the bonding layer and into silicon substrate 125 during the post-cleave and/or activation anneal. After the post-cleave anneal and/or activation anneal the concentration of dopant in depleted layer is between about 1E16 atm/cm$^3$ and about 1E20 atm/cm$^3$ and the concentration of dopant buried doped layer 135 layer is between about 1E16 atm/cm$^3$ and about 1E20 atm/cm$^3$. Silicon oxide layer 105 and depleted layer 140 form a buried dielectric layer 145 of a now completed SOI substrate 150. If a CMP smoothing is performed instead of a post-cleave anneal smoothing, the CMP may be postponed until after the activation anneal is performed.

Silicon substrate 125 may be doped or intrinsic (i.e., undoped). In a first example, doped layer 125 is doped and substrate 125 is intrinsic. In a second example, doped layer 135 is doped a different dopant type and to a higher concentration than substrate 125. In a third example, doped layer 135 is doped a same dopant type but to a higher concentration than substrate 125.

It is a feature of the present invention that doped layer 135 is not formed by ion-implantation of dopant through silicon layer 120 into substrate 125 so as not to damage the crystal structure silicon layer 120.

In one example, SOI substrate 150 is a wafer having a diameter of about 200 mm. In one example, SOI substrate 150 is a wafer having a diameter of about 300 mm. The method is applicable to fabricating SOI wafers having diameters less than 200 mm and more than 300 mm. A wafer has the geometric shape of a circular disk.

Figure 2A:
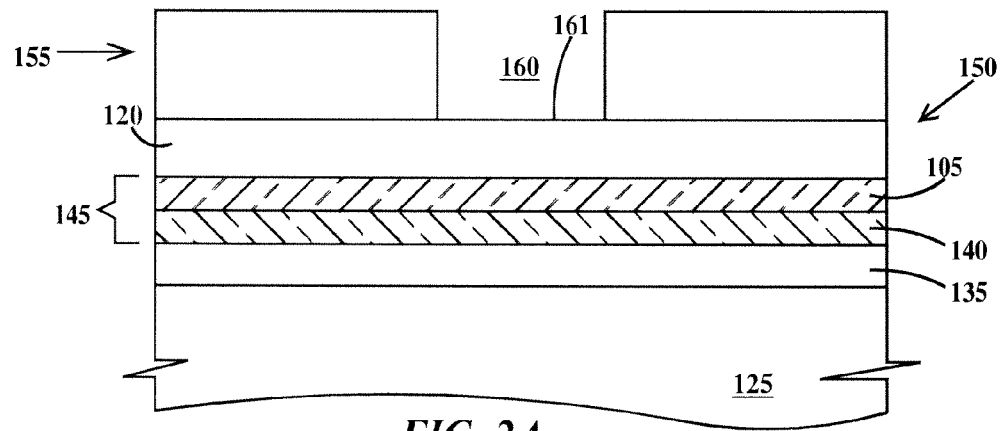
FIGS. 2A through 2C are cross-sectional drawings illustrating fabrication of a diode in the doped layer of a silicon-on-insulator substrate according to embodiments of the present invention.
Figure 2B:
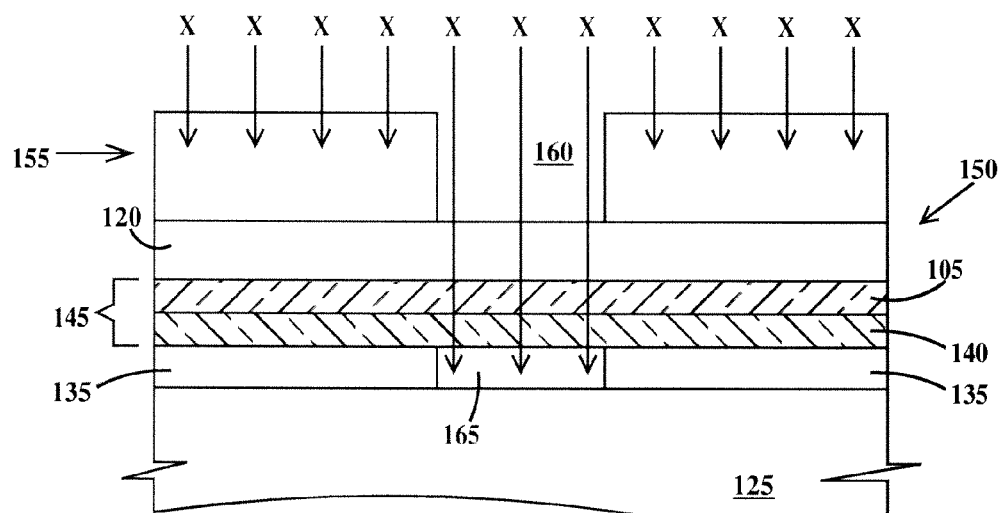
Figure 2C:
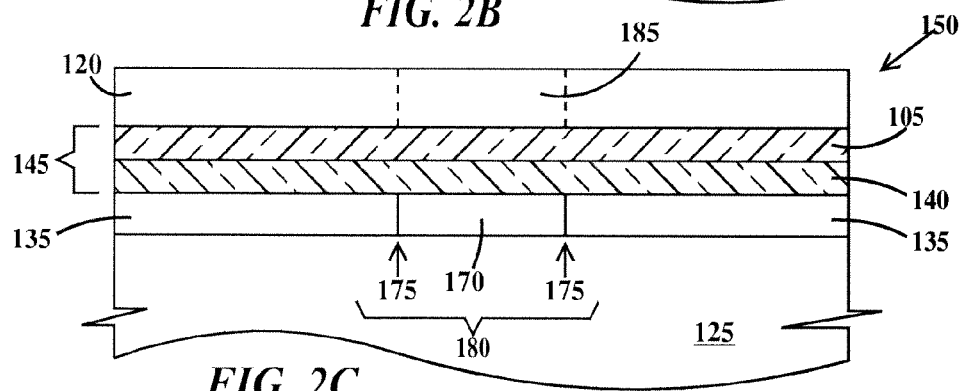

FIGS. 2A through 2C are cross-sectional drawings illustrating fabrication of a diode in the doped layer of a silicon-on-insulator substrate according to embodiments of the present invention. In FIG. 2A, a photoresist layer 155 is formed on SOI substrate 150 and an opening 160 photolithographically formed in the photoresist layer. A top surface 161 of silicon layer 120 is exposed in opening 160.

A photolithographic process is one in which a photoresist layer is applied to a surface of a substrate, the photoresist layer exposed to actinic radiation through a patterned photomask and the exposed photoresist layer developed to form a patterned photoresist layer. When the photoresist layer comprises positive photoresist, the developer dissolves the regions of the photoresist exposed to the actinic radiation and does not dissolve the regions where the patterned photomask blocked (or greatly attenuated the intensity of the radiation) from impinging on the photoresist layer. When the photoresist layer comprises negative photoresist, the developer does not dissolve the regions of the photoresist exposed to the actinic radiation and does dissolve the regions where the patterned photomask blocked (or greatly attenuated the intensity of the radiation) from impinging on the photoresist layer.

After additional processing (e.g., an etch or an ion-implantation), the patterned photoresist is removed. This additional processing results in a physical change to the substrate. The photoresist layer may optionally be baked at one or more of the following steps: prior to exposure to actinic radiation, between exposure to actinic radiation and development, after development.

In FIG. 2B, an ion-implantation of a dopant species X (e.g., Ar, P or B) is performed to form an ion-implanted region 165 in doped layer 135 under opening 160. Photoresist 155 blocks ion-implantation into and through silicon layer 120. Species X is of an opposite dopant type than the dopant species of doped layer 135. The ion implant energy is adjusted to as the peak of the dopant distribution is below buried dielectric layer 145.

In FIG. 2C, an anneal at a temperature of about 500° C. or more is performed to activate the dopant species of ion-implanted region 165 and form an oppositely doped region 170 within doped region 135. It will be realized that doped region 170 will contain dopant of both N and P type so the ion-implantation of implanted region 165 (see FIG. 2B) must be high enough so as to result in a net doping opposite to the dopant type of doped layer 135. If doped layer 135 is doped N-type, doped region 170 is net-doped P-type. If doped layer 135 is doped P-type, doped region 170 is net-doped N-type. In one example the net dopant concentration of doped region 170 is between about $1E16$ atm/cm$^3$ and about $1E18$ atm/cm$^3$. Doped layer 135 and doped region 170 are separated by a PN junction 175 and form a diode 180. When doped layer 135 is N-type (and doped region 170 is net doped P-type), doped layer 135 it is the cathode of diode 180 and doped region 170 is the anode of the diode 180. When doped layer 135 is P-type (and doped region 170 is net doped N-type), doped layer 135 it is the anode of diode 180 and doped region 170 is the cathode of the diode 180. Because only doped region 170 has been formed by ion-implantation through silicon layer 120, any crystal damage caused to silicon layer 120 by the ion-implantation of FIG. 2B is limited to a region 185 (between the dashed lines) directly above doped region 170. Because ion implanting boron causes less silicon-crystal damage than implanting arsenic or phosphorus, it is preferred that doped layer 135 be doped N-type (with As preferred) and doped region 170 be net doped P-type (with B preferred).

Figures 3A, 3B:
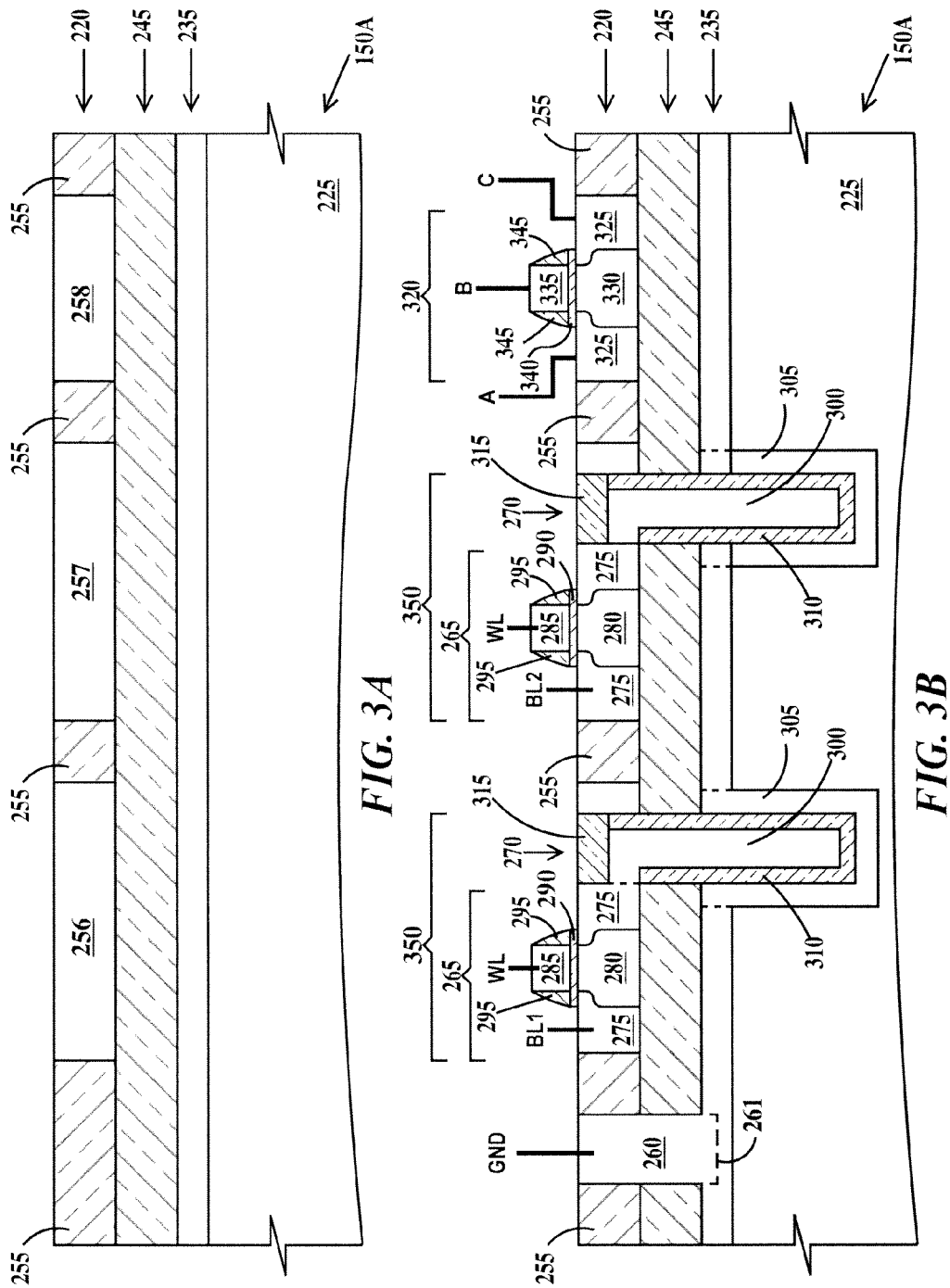
FIGS. 3A through 3B are cross-sectional drawings illustrating fabrication of a dynamic random access memory cells and complimentary metal-oxide-silicon logic devices in a silicon-on-insulator substrate according to embodiments of the present invention.

FIGS. 3A through 3B are cross-sectional drawings illustrating fabrication of a dynamic random access memory (DRAM) cells and complimentary metal-oxide-silicon (CMOS) logic devices in a silicon-on-insulator substrate according to embodiments of the present invention. In FIG. 3A an SOI substrate 150A is similar to SOI substrate 150 of FIG. 2E with substrate 255 being equivalent to substrate 125 of FIG. 2E, buried doped layer 235 being equivalent to buried doped layer 235 of FIG. 2E, buried dielectric layer 245 being equivalent to buried dielectric layer 145 of FIG. 2E and silicon layer 220 being equivalent to silicon layer 120 of FIG. 2E. Formed in silicon layer 220 is dielectric trench isolation 255. Trench isolation 255 is formed by etching a trench in silicon layer 220 down to buried dielectric layer 245, filling the trench with a dielectric (e.g., silicon oxide) and performing a planarization process so top surface of silicon layer 220 and trench isolation are coplanar. In one example the planarization process includes a CMP process. Trench isolation may contact buried dielectric layer 245 (as illustrated in FIG. 3A) or extend into buried dielectric layer 245. The purpose of trench isolation 255 is to form silicon islands 256, 257 and 258 in silicon layer 220 that are electrically isolated from each other.

Turning to FIG. 3B, In FIG. 3B a substrate contact, two (DRAM) cells and a field effect transistor (FET) representing CMOS logic devices are formed in/on substrate 150A. A DRAM cell comprises an FET and a trench capacitor connected between the source of an NFET (or drain of a PFET) and ground. An electrically conductive contact 260 is formed through buried dielectric layer 245 and into buried doped layer 235. A bottom 261 of contact 260 is terminated within buried doped layer 235. In one example, contact 260 comprises doped polysilicon or a refractory metal such as tungsten. It is advantageous that contact 260 be doped the same dopant type as buried doped layer 235. Contact 260 may be formed, for example, by etching a trench through trench isolation 255 and buried dielectric layer 245 to buried doped layer 235 (or through buried doped layer 235 to substrate 225), filling the trench with doped polysilicon or a refractory metal such as tungsten and performing a planarization process (e.g., CMP) so a top surface of contact 260 is coplanar with a top surface of trench isolation 255. Substrate contact is electrically isolated from silicon layer 220 by trench isolation 255.

In FIG. 3B, two FETs 265 and two respective trench capacitors 270 are formed within silicon islands 256 and 257 (see FIG. 3A). FETs 265 each comprise source/drains 275 separated by a channel region 280 in silicon layer 220. Channel region 280 is electrically isolated from a gate electrode 285 by a gate dielectric 290. Gate electrode 285 is positioned over channel region 280. Optional dielectric sidewall spacers 295 are also illustrated. Trench capacitors 270 comprise an electrically conductive inner plate 300 electrically isolated from an electrically conductive diffused outer plate 305 by dielectric layer 310. Inner plate 300 physically and electrically contacts one source/drain 275. A dielectric cap 315 is formed on top of inner plate 270. In one example, inner plate 300 is formed from doped polysilicon, dielectric layer 310 is silicon oxide, and outer plate 305 comprise a doped layer of buried doped layer 235 and substrate 225.

In one example, trench capacitors 270 are formed by etching a trench through silicon layer 220, buried dielectric layer 245, buried doped layer 235 into substrate 225. The trenches are filled with, for example, As doped glass and annealed at a temperature sufficient to drive dopant from the glass into buried layer 235 and substrate 225 along the sidewalls of the trench. Then the doped glass layer is removed and dielectric layer 310 formed on the sidewalls and bottom of the trench. Dielectric layer 310 may be formed by thermal oxidation or deposition. (as illustrated). Then remaining space in the trench is filled with more doped polysilicon. Generally, in DRAM cells the trench capacitors are formed before the FETs are formed.

FETs 265 may be formed by forming gate dielectric layer on silicon layer 220, forming a polysilicon layer on the gate dielectric layer, patterning the polysilicon layer to form gate electrodes 285 and ion implanting a dopant species into source/drains 275. It is advantageous that source/drains 275, inner and outer plates 305 and 310 and buried doped layer 235 are doped the same type. When FETs 265 are NFETs, source/drains 275, inner and outer plates 305 and 310 and buried doped layer 235 are doped N-type.

FET 320 represents a CMOS logic device formed in silicon island 258 (see FIG. 3A). FET 320 comprises source/drains 325 separated by a channel region 330 in silicon layer 220. Channel region 330 is electrically isolated from a gate electrode 335 by a gate dielectric 340. Gate electrode 335 is positioned over channel region 330. Optional dielectric sidewall spacers 345 are also illustrated. FET 320 is formed in a manner similar to that of FETs 265. In one example, FETs 265 and 320 are formed simultaneously, with the understanding that since NFETs and PFETs are formed separately, FETs 265 and 320 are formed simultaneously only when FETs 265 and 320 are all NFETs or when FETs 265 and 320 are all PFETs.

In FIG. 3B, DRAM cells 350 are each comprised of a respective FET 265 and trench capacitor 270. While only two DRAM cells 350 are illustrated in FIG. 3B, there may be more than two DRAM cells. While only one FET 320 representing CMOS logic is illustrated in FIG. 3B, there are generally a multiplicity of FETs 320, some being NFETs and some being PFETs.

When wired into a DRAM array, gates 285 are electrically connected to a same wordline (WL) wire and the non-capacitor connected source/drain 275 are electrically connected to different bitlines (BL1, BL2) wires and outer plates 305 are connected to a ground (GND) wire through buried doped layer 235 to contact 260. The ground wire is a low voltage rail of power distribution network (often zero volts). The high voltage rail is often called Vdd in logic and memory circuits and is at least a few tenths of a volt positive.

Alternatively, the gates may be connected to different wordlines and the non-capacitor connected source/drains to a same bitlines. Because of the buried doping layer 235 connecting the substrate contact to the outer plates, a low resistance connection to ground via doped layer 235 and contact 260 is established that enhances the performance and reduces noise of DRAM cells 350 compared to DRAM cells built by current methods without the buried doped layer and rely on the substrate for a ground connection. Also, because no ion-implantation has been performed to generate buried doped layer 235, the silicon layer 220 in which FETs 265 and 320 have not been damaged during formation of the buried doped layer also enhancing performance of the FETs.

It should be understood that contact 260 is provided to contact buried doped layer 235 and thence outer plates 235. Substrate only contacts may be formed for the express purpose of electrically contacting substrate 225 and not electrically contacting buried doped layer 235. For those substrate contacts, a dielectric liner is provided on the sidewalls of the trench, but not the bottom before filling the trench with polysilicon to form the substrate only contact. It should be further understood that by extending contact 260 into substrate 225 a substrate contact may be formed that electrically contacts both buried layer 235 and substrate 225.

When used in a CMOS logic circuit, connections A, B, and C are wires connecting FET 320 to other FETS (not shown) in the logic circuit, which may include PFETs and NFETs.

Thus the embodiments of the present invention provide (silicon-on-insulator substrates with built-in junctions,) a method of making silicon-on-insulator substrates with built-in junctions and integrated circuit devices fabricated on silicon-on-insulator substrates with built-in junctions that minimize or eliminate damage to the buried insulator layer and/or silicon layer on top of the buried insulator layer.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
providing a silicon-on-insulator substrate, said silicon-on-insulator substrate comprising a silicon layer separated from a silicon substrate by a buried dielectric layer and including a doped layer in said substrate, said doped layer adjacent to said buried dielectric layer, said doped layer not formed by ion-implantation of a dopant species through said silicon layer;
forming dielectric isolation in said silicon layer, said dielectric isolation separating said silicon layer into electrically isolated silicon islands;
forming dynamic random access memory (DRAM) cells in respective silicon islands, each DRAM cell comprising a field effect transistor (FET) and a respective trench capacitor, each trench capacitor of said respective trench capacitors comprising a dielectric layer isolating a doped polysilicon inner plate from a diffused outer plate, said diffused outer plate formed in said doped layer and said substrate, said doped layer electrically contacting said outer plate, and
forming an electrically conductive contact extending through said trench isolation and said buried dielectric layer into said doped layer.

2. The method of claim 1, further including:
said inner plates of said trench capacitors contacting first source/drains of said respective FETs;
connecting second source/drains of said respective FETs to bitlines of a memory array;
connecting gates of said FETS to wordlines of said memory array; and
connecting said contact to a ground rail of a power distribution network.

3. The method of claim 2, further including:
forming additional FETs in respective silicon islands; and
connecting said additional FETs into logic circuits.

4. The method of claim 2, further including:
forming said silicon-on-insulator substrate by:
  forming an oxide layer on a silicon first substrate;
  ion-implanting hydrogen through said oxide layer into said first substrate, to form a fracture zone in said substrate;
  forming a doped dielectric bonding layer on a silicon second substrate;
  bonding a top surface of said doped bonding layer to a top surface of said oxide layer;
  thinning said first substrate by thermal cleaving of said first substrate along said fracture zone to form a silicon layer on said oxide layer to form a bonded substrate; and
  heating said bonded substrate to drive dopant from said bonding layer into said second substrate to form a doped layer in said second substrate adjacent to said bonding layer.

5. An electronic device, comprising:
a silicon-on-insulator substrate, said silicon-on-insulator substrate comprising a (i) silicon layer separated from a silicon substrate by a buried dielectric layer, said buried dielectric layer including a silicon oxide layer adjacent to said silicon layer and a dopant depleted dielectric layer adjacent to said silicon oxide layer, and (ii) a doped layer in said substrate, said doped layer adjacent to said dopant depleted dielectric layer;
dielectric isolation in said silicon layer, said dielectric isolation separating said silicon layer into electrically isolated silicon islands;

dynamic random access memory (DRAM) cells in respective silicon islands, each DRAM cell comprising a field effect transistor (FET) and a respective trench capacitor, each trench capacitor of said respective trench capacitors comprising a dielectric layer isolating a doped polysilicon inner plate from a diffused outer plate, said diffused outer plate formed in said doped layer and said substrate, said doped layer electrically contacting said outer plate, and an electrically conductive contact extending through said trench isolation and said buried dielectric layer into said doped layer.

6. The device of claim 5, further including:

said inner plates of said trench capacitors contacting first source/drains of said respective FETs;

second source/drains of said respective FETs connected to bitlines of a memory array;

gates of said FETS connected to wordlines of said memory array; and said contact connected to a ground rail of a power distribution network.

7. The device of claim 5, further including:

additional FETs in respective silicon islands, said additional FETs connected into logic circuits.

8. The device of claim 5, wherein:

dopant species of said doped dielectric layer and said doped layer are a same dopant species; and a dopant type of said outer plates of said trench capacitors and said doped layer are a same dopant type.

9. The device of claim 5, wherein said doped dielectric layer is doped glass.

* * * * *